United States Patent
Gerdes et al.

(10) Patent No.: US 9,702,938 B2
(45) Date of Patent: Jul. 11, 2017

(54) METHOD AND APPARATUS FOR DETECTING PHASE IMBALANCE OF AN ELECTRICAL COMPONENT IN A MACHINE

(71) Applicant: Caterpillar Inc., Peoria, IL (US)

(72) Inventors: Jesse R. Gerdes, Dunlap, IL (US); Jackson Wai, Dunlap, IL (US); Ahmed Khalil, Peoria, IL (US); Benjamin P. Gottemoller, Princeville, IL (US)

(73) Assignee: Caterpillar Inc., Peoria, IL (US)

( * ) Notice: Subject to any disclaimer, the term of this patent is extended or adjusted under 35 U.S.C. 154(b) by 44 days.

(21) Appl. No.: 14/661,193

(22) Filed: Mar. 18, 2015

(65) Prior Publication Data

US 2016/0274191 A1 Sep. 22, 2016

(51) Int. Cl.
*H02P 21/00* (2016.01)
*G01R 31/34* (2006.01)
*B60L 3/00* (2006.01)

(52) U.S. Cl.
CPC .......... *G01R 31/343* (2013.01); *B60L 3/0061* (2013.01)

(58) Field of Classification Search
CPC ..... H02P 21/0035; H02P 21/06; Y02T 10/643
USPC ................ 318/400.02, 432, 400.22
See application file for complete search history.

(56) References Cited

U.S. PATENT DOCUMENTS

| | | | |
|---|---|---|---|
| 4,291,368 A * | 9/1981 | Yarema | H02M 7/527 363/41 |
| 4,319,298 A | 3/1982 | Davis et al. | |
| 7,294,988 B2 * | 11/2007 | Ajima | B60K 6/26 318/430 |
| 7,511,449 B2 * | 3/2009 | Speckhart | H02P 21/09 318/798 |
| 7,556,762 B2 * | 7/2009 | Ooyama | B29C 47/903 264/514 |
| 7,956,762 B2 | 6/2011 | Bailey et al. | |
| 7,996,163 B2 * | 8/2011 | Bailey | B60K 6/46 702/117 |
| 8,410,739 B2 * | 4/2013 | Hendrickson | B60L 3/0023 318/434 |
| 2010/0066294 A1 | 3/2010 | Hendrickson et al. | |
| 2012/0212167 A1 * | 8/2012 | Wu | H02P 6/14 318/400.13 |

(Continued)

FOREIGN PATENT DOCUMENTS

| | | |
|---|---|---|
| JP | 10313562 A | 11/1998 |
| JP | 3561882 B2 | 9/2004 |
| WO | 2014/156386 A1 | 10/2014 |

*Primary Examiner* — Rina Duda
(74) *Attorney, Agent, or Firm* — Baker Hostetler; Jeff A. Greene

(57) ABSTRACT

A method for detecting a phase imbalance of an electrical component in a machine due to an actual fault is provided. The method includes receiving electrical parameter values associated with a plurality of phases of an electrical component, detecting a phase imbalance in the plurality of phases, calculating an imbalance ratio of the plurality of phases, applying a plurality of conditions to the imbalance ratio and to the received input vector, the plurality of conditions being associated with an actual fault in the machine, and determining whether the detected phase imbalance is due to a controls induced imbalance in the machine or due to the actual fault in the electrical component of the machine when at least one of the plurality of conditions is met.

17 Claims, 5 Drawing Sheets

(56) References Cited

U.S. PATENT DOCUMENTS

2013/0049733 A1\* 2/2013 Neti .................... G01R 31/343
                                                            324/71.1
2013/0077194 A1\* 3/2013 Hasan ................... H02P 29/022
                                                            361/31

\* cited by examiner

METHOD AND APPARATUS FOR DETECTING PHASE IMBALANCE OF AN ELECTRICAL COMPONENT IN A MACHINE

TECHNICAL FIELD

This patent disclosure relates generally to electrical components and systems, and more particularly, to a method and an apparatus for detecting phase imbalance of an electrical component in a machine.

BACKGROUND

Electrical components in various machines have fluctuations in electrical parameters during operation. Such fluctuations may cause a phase imbalance, which is monitored to determine if an electrical component has failed and/or if the machine needs to be shut down. One such method and apparatus for detecting phase current imbalance in a power generator is disclosed in U.S. Patent Application Publication No. 2010/0066294.

Conventionally, detection of such phase imbalance is deemed as a failure of a component in the machine, and may require immediate attention of an operator of the machine. More often than not, the operator has to shut down the machine for verifying a reason behind the phase imbalance, troubleshooting and/or repairing such a presumed failure. However, in many scenarios, such phase imbalance is due to controls induced phenomena, which are not actual faults or failures of the electrical components in the machine. Even when the phase imbalance due to such controls induced phenomena can be ignored, conventional systems misidentify the phase imbalance to be a fault in the machine and require shut down of the machine incurring expensive downtimes and causing potential delays in the project for which the machine was deployed.

Accordingly, there is a need to resolve these problems and other problems related to conventional methods and systems that detect phase imbalance.

SUMMARY

In one aspect of this disclosure, a method for detecting a phase imbalance of an electrical component in a machine due to an actual fault is provided. The method includes receiving, at an electronic controller unit of a machine, an input vector having electrical parameter values associated with a plurality of phases of an electrical component, detecting, at the electronic controller unit, a phase imbalance in the plurality of phases, calculating, at the electronic controller unit, an imbalance ratio of the plurality of phases, applying, at the electronic controller unit, a plurality of conditions to the imbalance ratio and to the received input vector, the plurality of conditions being associated with an actual fault in the machine, determining, at the electronic controller unit, whether the detected phase imbalance is due to a controls induced imbalance in the machine or due to the actual fault in the electrical component of the machine when at least one of the plurality of conditions is met, and controlling an output of the machine, using the electronic controller unit, when the phase imbalance is due to the actual fault in the electrical component of the machine.

In another aspect of this disclosure, an electronic controller unit is coupled to an electrical component of a machine. The electronic controller unit includes a processor coupled to an input port, an output port, and a memory in the electronic controller unit. The processor is configured to execute computer executable instructions for differentiating a phase imbalance due to an actual fault from a controls induced phase imbalance, the computer executable instructions residing on the memory. The computer executable instructions when executed by the processor cause the processor to detect the phase imbalance in a plurality of phases of the machine, calculate an imbalance ratio of the plurality of phases of the electrical component based upon an input vector having electrical parameter values received from the electrical component at the input port of the electronic controller unit, the electrical parameter values being associated with the plurality of phases, compare the imbalance ratio with a threshold vector stored in the memory to generate a threshold comparison vector, the threshold vector including at least two values corresponding to an upper threshold value and a lower threshold value, apply at least one of a plurality of conditions stored in the memory to the input vector, the plurality of conditions being associated with the actual fault in the machine, determine whether the phase imbalance is due to a controls induced imbalance in the machine or due to the actual fault in the electrical component in the machine when the threshold comparison vector is generated and the at least one of the plurality of conditions has been met, and control, via the output port of the electronic controller unit, an output of the machine when the phase imbalance is due to the actual fault in the machine.

In yet another aspect of this disclosure, a non-transitory computer readable medium is configured to store computer executable instructions thereupon for detecting a phase imbalance of an electrical component in a machine due to an actual fault in the machine. The computer executable instructions when executed by a processor of an electronic controller unit of the machine cause the processor to receive an input vector having electrical parameter values from the electrical component, the electrical parameter values being associated with a plurality of phases of the electrical component, compare the input vector against minimum values stored in a minimum value vector, determine whether the input vector is greater than the minimum value vector for a predefined amount of time, identify phases with maximum electrical parameter values and minimum electrical parameter values in the input vector for a current cycle, determine the identified phases as being different from or same as phases with maximum electrical parameter values and minimum electrical parameter values from a previous cycle, determine whether the phase imbalance detected among the plurality of phases of the electrical component is due to the actual fault in the electrical component in the machine when the phases with the maximum electrical parameter values and the minimum electrical parameter values in the current cycle are the same as the phases identified in the previous cycle, and control, via an output port of the electronic controller unit, an output of the machine when the phase imbalance is due to the actual fault.

DETAILED DESCRIPTION

Figure 1:
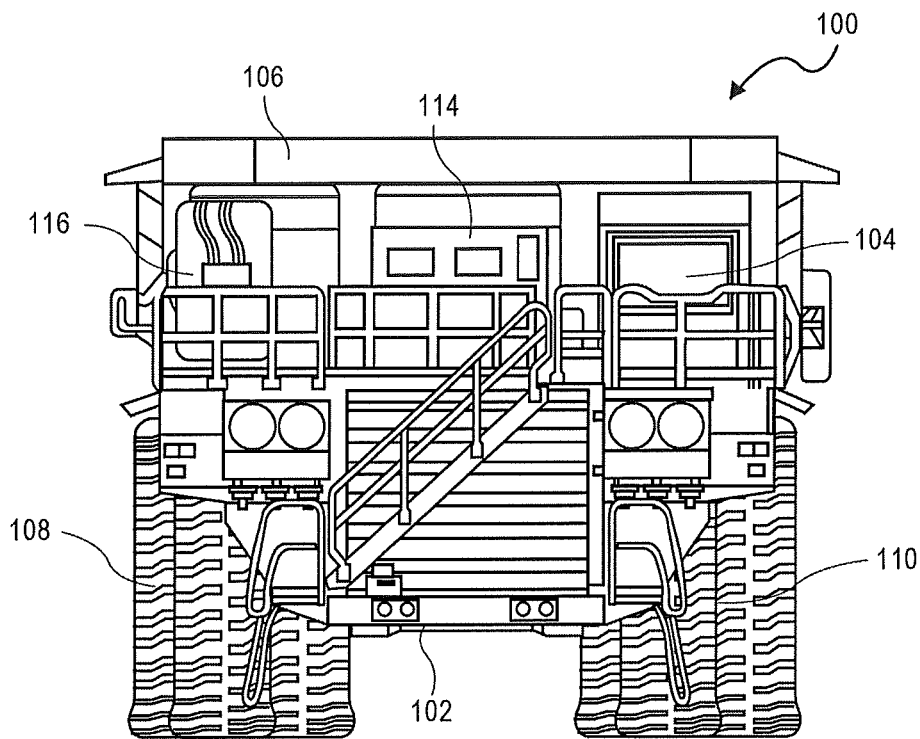
FIGS. 1 and 2 illustrate front and side views, respectively, of an exemplary machine, in accordance with an aspect of this disclosure.

This disclosure relates to a method and an apparatus for detecting a phase imbalance of an electrical component of a machine, and for differentiating false alarms of phase imbalance from actual faults causing the phase imbalance. Now referring to the drawings, wherein like reference numbers refer to like elements, there is illustrated in FIGS. 1 and 2, respectively, by way of example only and not by way of limitation, a front view and a side view of a machine 100.

The machine 100 may be a mobile machine or a stationary machine (with some moving parts) that performs functions associated with industries such as mining, construction, farming, transportation, landscaping, or the like. For example, the machine 100 may be an off-highway truck, as depicted in FIGS. 1 and 2, a motor grader, or other earth-moving machine. While the following detailed description describes exemplary aspects in connection with an off-highway truck, it should be appreciated that the description applies equally to the use of the present disclosure in other machines such as a track type tractor, a dozer, a scraper, a backhoe loader, a paver, a crane, or other types of machines or vehicles having direct series electric drive systems or electric-only arrangements. In one aspect, the machine 100 may be operating on a worksite and may be in communication with a base station and/or a global navigation satellite system (GNSS) 128. As such, the term "machine," as used with respect to the machine 100, is used to generically describe any machine having electrical components aiding operation of the machine 100. Electrical power may be generated onboard the machine 100 (e.g., by a power-generation device). Alternatively, electrical power may be stored but not generated on-board the machine 100.

Figure 2:
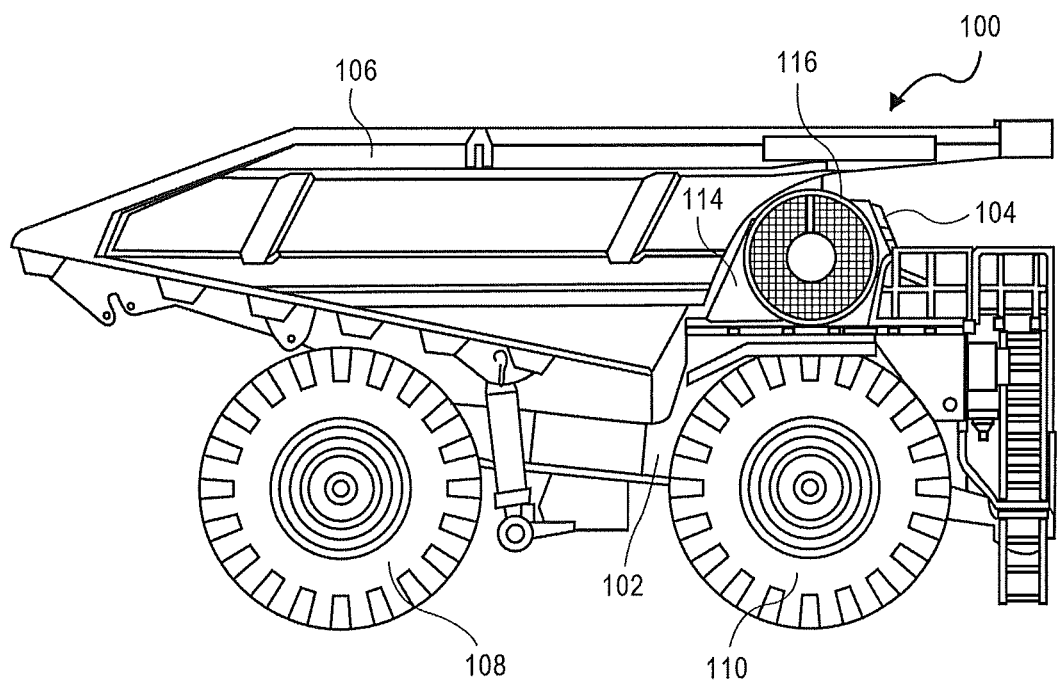

A front view of the machine 100 is shown in FIG. 1, and a side view is shown in FIG. 2. The machine 100 includes a chassis 102 that supports an operator cab 104 and an implement 106. The implement 106 is pivotally connected to the chassis 102 and is arranged to carry a payload when the machine 100 is in service. For example, the implement 106 may be a bucket, a blade, a scraper, a drill, a pounder, a leveler, or other types of implements suitable for use at the worksite on which the machine 100 is operating. An operator occupying the operator cab 104 can control the motion and the various functions of the machine 100. Alternatively, the machine 100 may be operated via signals transmitted from a remote base station over a wireless or a satellite network, e.g., when a human operator cannot operate the machine 100.

The chassis 102 supports various electric drive system components. These electric drive system components are configured to a set of drive wheels 108 to propel the machine 100. A set of idle wheels 110 can steer such that the machine 100 can move in any direction. Even though the chassis 102 in the machine 100 is rigid with and is configured to power the set of drive wheels 108 for motion and steer the set of idle wheels 110, it will be appreciated that other configurations of the machine 100 may be used. For example, such configurations may include an articulated chassis with one or more driven wheels. The machine 100 may include additional components including but not limited to a blower 116 to direct heat generated in the machine 100 and a cabinet 114 to contain various electrical and electro-mechanical components of the machine 100.

Figure 3:
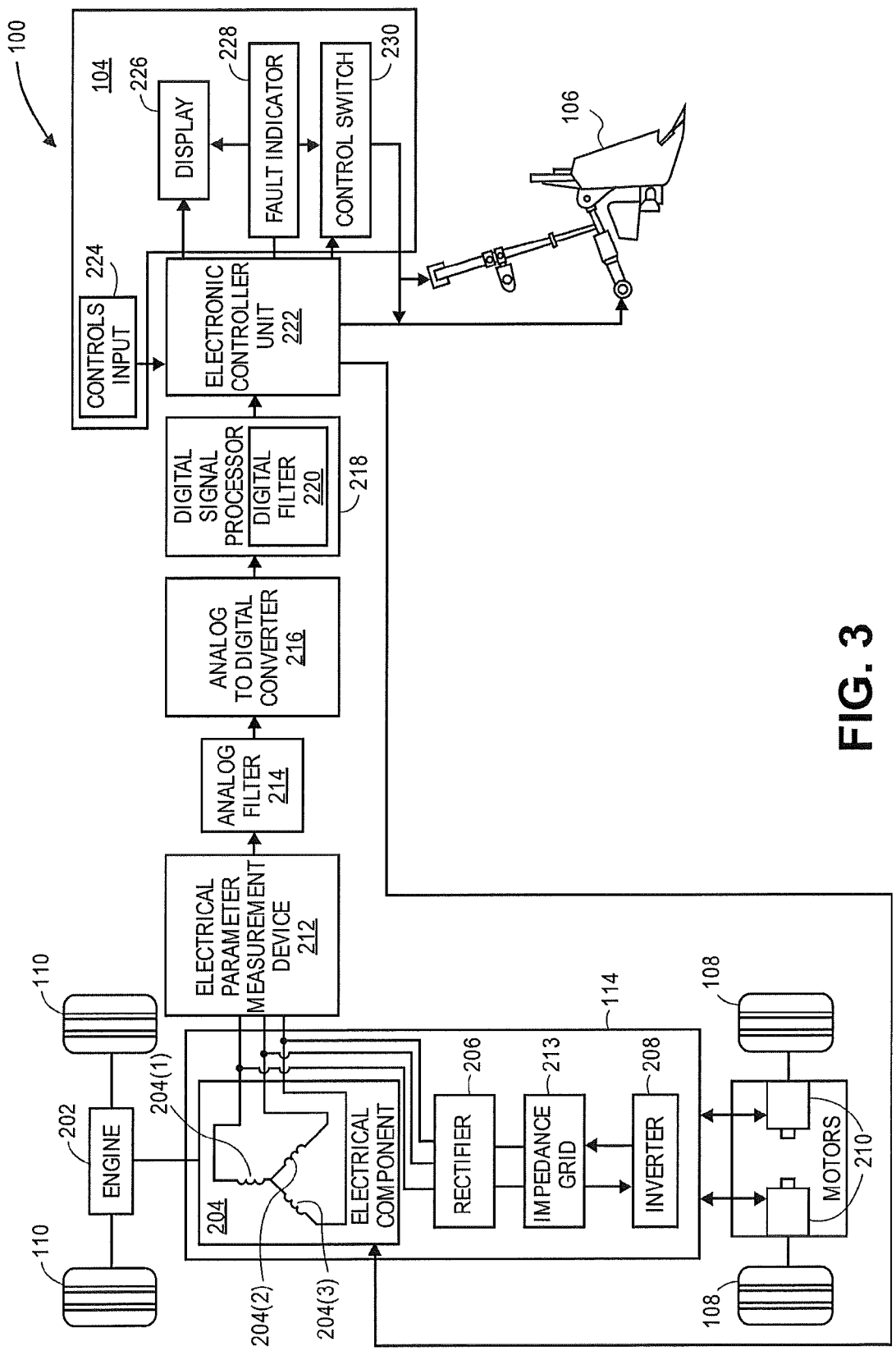
FIG. 3 illustrates an exemplary block diagram of various components in the machine of FIGS. 1 and 2 including an electrical component and an electronic controller unit, in accordance with an aspect of this disclosure.

Referring to FIG. 3, there is illustrated an exemplary block diagram of various components in the machine 100 of FIGS. 1 and 2, in accordance with an aspect of this disclosure. In one aspect of this disclosure, the machine 100 is a direct series electric drive machine, which in this instance refers to the use of more than one source or form of power to drive the drive wheels 108. The direct series electric drive system includes an engine 202, for example, an internal combustion engine such as a diesel engine, which produces an output torque at an output shaft (not shown). The output shaft of the engine 202 is connected to an electrical component 204, e.g., to a rotor of the electrical component 204. The electrical component 204 includes a plurality of phases 204a, 204b, and 204c, although it will be appreciated that the electrical component 204 may include any number of phases, depending upon the design and application of the electrical component 204 in the machine 100. For example, instead of three of the plurality of phases 204a, 204b, and 204c illustrated in FIG. 3, the electrical component 204 may include a single phase, two phases, four phases, or a higher number of phases to generate electrical power in the machine 100. The plurality of phases 204a, 204b, and 204c may be connected in a star connection or a delta connection, as known to one of ordinary skill in the art. By way of example only and not by way of limitation, the electrical component 204 may be a generator, an alternator, a switched reluctance (SR) motor, or the like configured to power a prime mover (not shown) of the machine 100. The electrical component 204 is, or is a part of, an electric drive of the machine 100 coupled to an electronic controller unit 222. Further, in view of the overall disclosure, it will be appreciated that although the electrical component 204 is exemplarily illustrated as being part of the machine 100, various aspects of this disclosure are equally applicable to the electrical component 204 as a standalone device used to output power or to receive power from sources other than the engine 202.

When the machine 100 is operating, the output shaft of the engine 202 rotates the rotor of the electrical component 204 to produce electrical power, for example, in the form of alternating current (AC) power. This electrical power is supplied to a rectifier 206 and converted to direct current (DC) power. The rectified DC power is provided to an inverter circuit 208 via an impedance grid 213. The rectified DC power may be converted again to an AC power by the inverter circuit 208. The inverter circuit 208 is configured to selectively adjust the frequency and/or pulse-width of its output, such that motors 210 that are connected to an output of the inverter circuit 208 may be operated at variable speeds. The motors 210 may be connected via final drive assemblies (not shown) or directly to drive the set of drive wheels 108 of the machine 100. During retardation of the machine 100, the motors 210 feed power back into the inverter circuit 208, which power is dissipated by the impedance grid 213 or stored elsewhere on the machine 100, e.g., in batteries (not shown). The power may be dissipated as heat directed away from the machine 100 by the blower 116. By way of example only and not by way of limitation, one or more of the electrical component 204, the rectifier 206, the impedance grid 213, and the inverter circuit 208 may be placed inside the cabinet 114 on the machine 100, adjacent to the operator cab 104.

In one aspect of this disclosure, the machine 100 includes an electrical parameter measurement device 212 connected to the electrical component 204. For example, the electrical parameter measurement device 212 may be coupled in parallel to the rectifier 206. Additionally or alternatively, although not shown explicitly, the electrical parameter measurement device 212 may be coupled to other electrical components in the machine 100 such as the inverter circuit 208, the motors 210, and the like, and the connection of the electrical parameter measurement device 212 to the electrical component 204 is by way of example only and not by way of limitation. The electrical parameter measurement device 212 may be a device configured to measure one or more electrical parameter values such as AC voltage, AC current, DC voltage, DC current, and/or magnetic flux associated with each of the plurality of phases 204a, 204b, and 204c of the electrical component 204. For example, the electrical parameter measurement device 212 may include a current sensing device, a voltage sensing device, a magnetometer, and the like, or combinations thereof.

An output of the electrical parameter measurement device 212 may be coupled to an analog filter 214 to filter transient conditions and noise. The analog filter 214 may be designed as a first order or a higher order filter based upon various cutoff-frequencies and/or frequency ranges, known to one of ordinary skill in the art. Examples of the analog filter 214 may include low-pass filters, high-pass filters, notch filters, or the like, and combinations thereof. A filtered output of the measurements of electrical parameters is then provided from the analog filter 214 to an analog to digital converter (ADC) 216. The ADC 216 may be an n-bit ADC, with 'n' being an integer expressible as a power of 2. The ADC 216 is configured to output a digital (binary) equivalent of the filtered analog output from the analog filter 214. For example, the electrical parameter values obtained by the electrical parameter measurement device 212 are converted to an equivalent binary format by the ADC 216. An output of the ADC 216 is then provided to a digital signal processor (DSP) 218.

The DSP 218 may include a digital filter 220 to filter out noise in the digitized value of the electrical parameters measured by the electrical parameter measurement device 212. Such filtered digitized electrical parameter values may be stored within the DSP 218 as an array or matrix of values referred to as an input vector 302 (discussed with respect to FIGS. 4-6). The DSP 218 may store the digitized electrical parameter values for a plurality of cycles corresponding to the electrical component 204, though the DSP 218 may store the digitized electrical parameter values for other time periods too, as will be appreciated by one of ordinary skill in the art.

As used in this disclosure, the term "cycle" may be an electrical cycle associated with the electrical component 204, or may include a unit of time or a time period for which measurements may be taken by the electrical parameter measurement device 212. The electrical cycle may be determined by an operating frequency of the electrical component 204 and may vary from one electrical component to the other. The time period that may define a cycle may be programmable and may also vary for various applications for which the machine 100 is used.

Further, it will be appreciated that although the electrical parameter measurement device 212, the analog filter 214, the ADC 216 and the DSP 218 are illustrated as separate devices of the machine 100, in an alternative aspect, these devices may be integrated as a single device having the functionality of these separate devices. For example, the electrical parameter measurement device 212 may include the analog filter 214 internally separated (e.g., by a galvanic isolation) from the ADC 216 and the DSP 218.

In one aspect of this disclosure, the electronic controller unit 222 is connected to an output of the DSP 218. In addition to the DSP 218 and/or the electrical parameter measurement device 212, the electronic controller unit 222 may be connected to or electrically coupled to a display 226, to a fault indicator 228, to a control switch 230, to a controls input 224 received from the operator cab 104 as the machine 100 is operated, to the implement 106 via hydraulic valves (not shown), and to the electrical component 204. Although not explicitly illustrated in FIG. 3, the electronic controller unit 222 is coupled (directly and/or operatively) to other parts of the machine 100 including but not limited to various sensors in the machine 100, the engine 202, the rectifier 206, the impedance grid 213, the inverter circuit 208, the motors 210, the set of drive wheels 108, the set of idle wheels 110, various cooling systems, control systems, fluid systems, and electrical systems of the machine 100. Therefore, the connections or couplings of the electronic controller unit 222 are shown by way of example only and not by way of limitation. The controls input 224 may be provided or input to the electronic controller unit 222 by an operator in the operator cab 104, or via remote controlled operation of the machine 100.

In one aspect of this disclosure, the fault indicator 228 may be an audio alarm, a visual indicator, or a combination of both to alert an operator of the machine 100 to a potential issue in the machine 100. In one aspect, the fault indicator 228 is controlled by the electronic controller unit 222. The fault indicator 228 may be used to trigger or activate the control switch 230, which in turn may control an output of the machine 100 by controlling positioning and/or movement of the implement 106, e.g., via hydraulic actuators (not shown). Alternatively or additionally, the electronic controller unit 222 may be directly or operatively coupled to the implement 106 to control positioning and/or movement thereof. The electronic controller unit 222 may be coupled to a network of sensors (not shown) on the machine 100. By connection to the network of sensors, the electronic controller unit 222 may be part of a data network (e.g., a J1939 network). Such a network of sensors provides various data regarding physical and operational parameters to the electronic controller unit 222 for processing. The data from the network of sensors is provided over one or more internal buses of the machine 100 (e.g., a Controller Area Network (CAN) bus). It will be appreciated that a physical placement of the various devices and components of the machine 100 shown in FIG. 3 are for discussion purposes by way of example only and an actual placement of these components and devices will vary depending upon a physical design or structure of the machine 100, as understood by one of ordinary skill in the art.

In one aspect, the display 226 may be a touch screen, a light emitting diode (LED) display, a plasma display, or other types of displays known to one of ordinary skill in the art. The display 226 may be configured to display various data and/or signals related to the machine 100 to an operator of the machine 100. For example, the display 226 may display real-time measurements from the electrical parameter measurement device 212 as a time varying plot.

Figure 4:
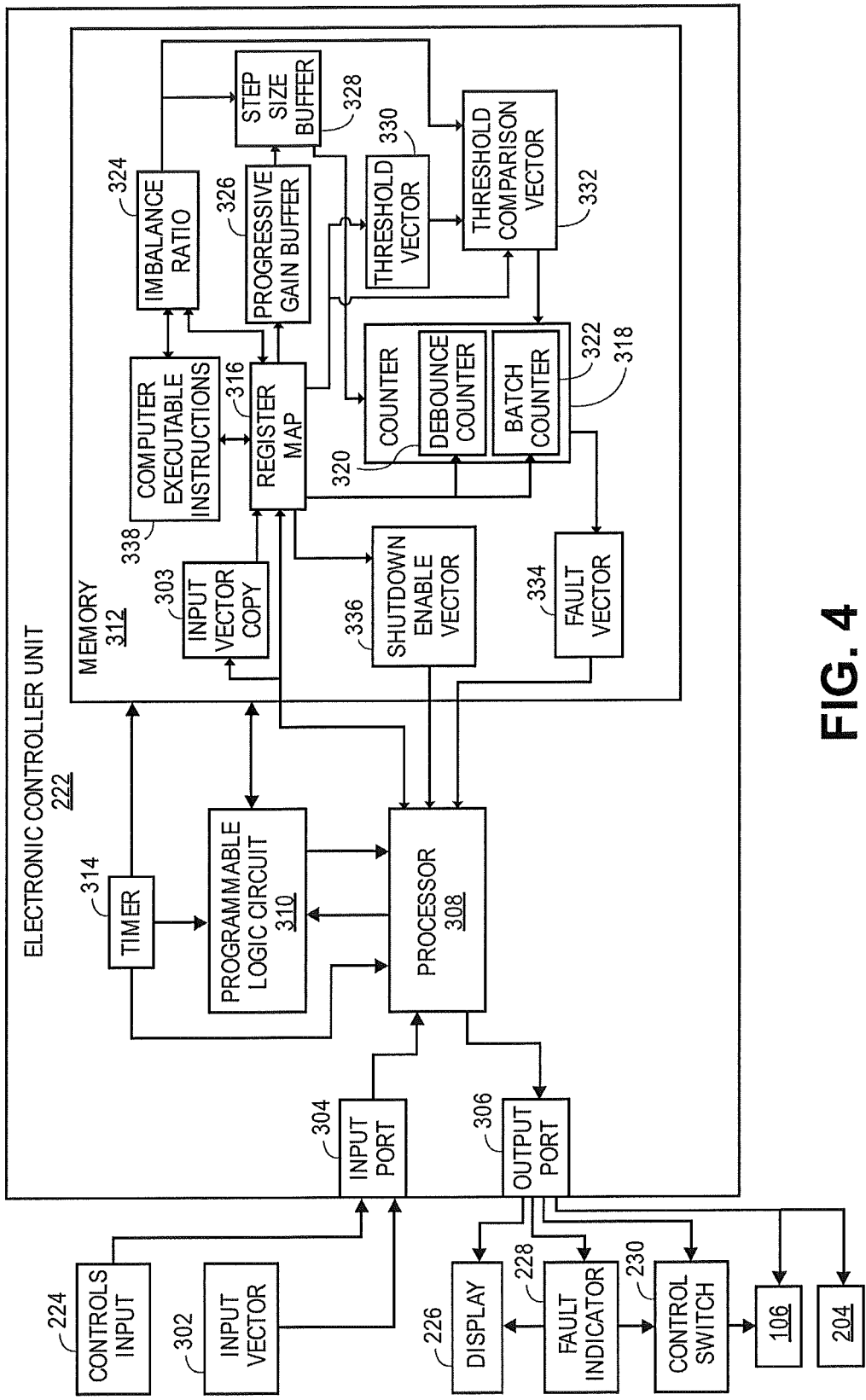
FIG. 4 illustrates exemplary internal features of the electronic controller unit of FIG. 3, in accordance with an aspect of this disclosure.

Referring now to FIG. 4, the electronic controller unit 222 is illustrated in accordance with an aspect of this disclosure. The electronic controller unit 222 includes a processor 308 coupled to an input port 304, an output port 306, a programmable logic circuit (PLC) 310, a memory 312, and a timer 314, as well as to other components within the electronic controller unit 222. The electronic controller unit 222 may include additional components known to one of ordinary skill in the art, which components are not explicitly illustrated in FIG. 4. For example, the electronic controller unit 222 may include heat sinks, visual indicators (e.g., light emitting diodes), impedance matching circuitry, internal buses, co-processors or monitor processors, batteries and power supply units, power controller chips, transceivers, wireless modules, satellite communication processing modules, and embedded systems on various integrated chips. In one aspect, the electronic controller unit 222 may be separate from an engine controller unit (not shown). In an alternative aspect, the electronic controller unit 222 may be integrated with or may share space and processing resources with the engine controller unit.

The input port 304 may be a single port or a collection of ports. The input port 304 is configured to receive various inputs and data from other parts of the machine 100 and forward such inputs and data to the processor 308. For example, the input port 304 receives the input vector 302 having the electrical parameter values measured by the electrical parameter measurement device 212 from the DSP 218. Likewise, the input port 304 may be configured to receive the controls input 224 from the operator of the machine 100 as an electrical signal.

Similarly, the output port 306 may be a single port or a collection of ports. The output port 306 is configured to output data and control signals from the processor 308 to control and communicate with various parts of the machine 100. For example, the output port 306 is configured to output signals to the fault indicator 228, the display 226, the control switch 230, the electrical component 204, and directly or indirectly to the implement 106 to control positions and movements thereof.

The processor 308 may be an integrated circuit (IC) chip that is fabricated to implement various features and functionalities of the aspects discussed herein. By way of example only and not by way of limitation, the processor 308 may be fabricated using a Complementary Metal Oxide Semiconductor (CMOS) fabrication technology. In one aspect, the processor 308 may be configured to execute computer executable instructions 338 in the memory 312 to carry out various operations discussed with respect to FIG. 6. In one aspect, the processor 308 is coupled to, and configured to communicate with, the programmable logic circuit (PLC) 310 and the memory 312.

The programmable logic circuit 310 may be an Application Specific Integrated Circuit (ASIC), a Field Programmable Gate Array (FPGA), a programmable Logic Array (PLA), a System-on-a-Chip (SOC), or the like. The programmable logic circuit 310 may include logic circuitry such as Boolean gates ("AND", "OR", and "NOT") to carry out various binary operations based on signals from the processor 308. The programmable logic circuit 310 may be coupled to the memory 312 to operate on data stored in the memory 312 upon receiving signals from the processor 308.

The timer 314 may include a clock generator to produce one or more timing signals or clock signals for use in synchronizing the processor 308, the programmable logic circuit 310 and the memory 312. The timer 314 may include crystal oscillators for producing fundamental frequencies and divider and multiplier circuits to generate additional clock frequencies from the fundamental frequency.

The memory 312 may be implemented as a non-transitory computer readable medium. By way of example only, the memory 312 may be a semiconductor based memory device including but not limited to random access memory (RAM), read only memory (ROM), Dynamic RAM, Programmable ROM, Electrically Erasable programmable ROM (EEPROM), Static RAM, Flash memory, combinations thereof, or other types of memory devices known to one of ordinary skill in the art. In one aspect, the memory 312 is coupled to the processor 308 and to the programmable logic circuit 310. In one aspect, the memory 312 may be made of or implemented using a non-transitory computer readable storage medium on which the computer executable instructions 338 reside. The computer executable instructions 338 when executed by the processor 308 cause the processor 308 to carry out the features and functionalities of the various aspects of this disclosure, such as those discussed with respect to FIG. 6. Such non-transitory computer readable storage medium may include semiconductor memory, optical memory, magnetic memory, mono- or bi-stable circuitry (flip-flops, etc.) and the like, or combinations thereof. Such non-transitory computer readable storage medium excludes signals that are transitory.

In one aspect of the disclosure, the memory 312 includes memory areas allocated to store a plurality of data including an input vector copy 303, a register map 316, an imbalance ratio 324, a threshold vector 330, a threshold comparison vector 332, a shutdown enable vector 336, a fault vector 334, a progressive gain buffer 326, a step size buffer 328, and a counter 318. The counter 318 may include a debounce counter 320 and a batch counter 322. The register map 316, the imbalance ratio 324, the threshold vector 330, the threshold comparison vector 332, the shutdown enable vector 336, the fault vector 334, the progressive gain buffer 326, the step size buffer 328, and the counter 318 are operated upon or used by the processor 308 for implementing various features and functionalities discussed herein. Generally, the register map 316, the imbalance ratio 324, the threshold vector 330, the threshold comparison vector 332, the shutdown enable vector 336, the fault vector 334, the progressive gain buffer 326, the step size buffer 328, and the counter 318 are identifiable via respective memory addresses in the memory 312 available to the processor 308. The role and usage of specific data stored in the register map 316, the imbalance ratio 324, the threshold vector 330, the threshold comparison vector 332, the shutdown enable vector 336, the fault vector 334, the progressive gain buffer 326, the step size buffer 328, and the counter 318 are discussed with reference to FIGS. 5 and 6.

Figure 5:
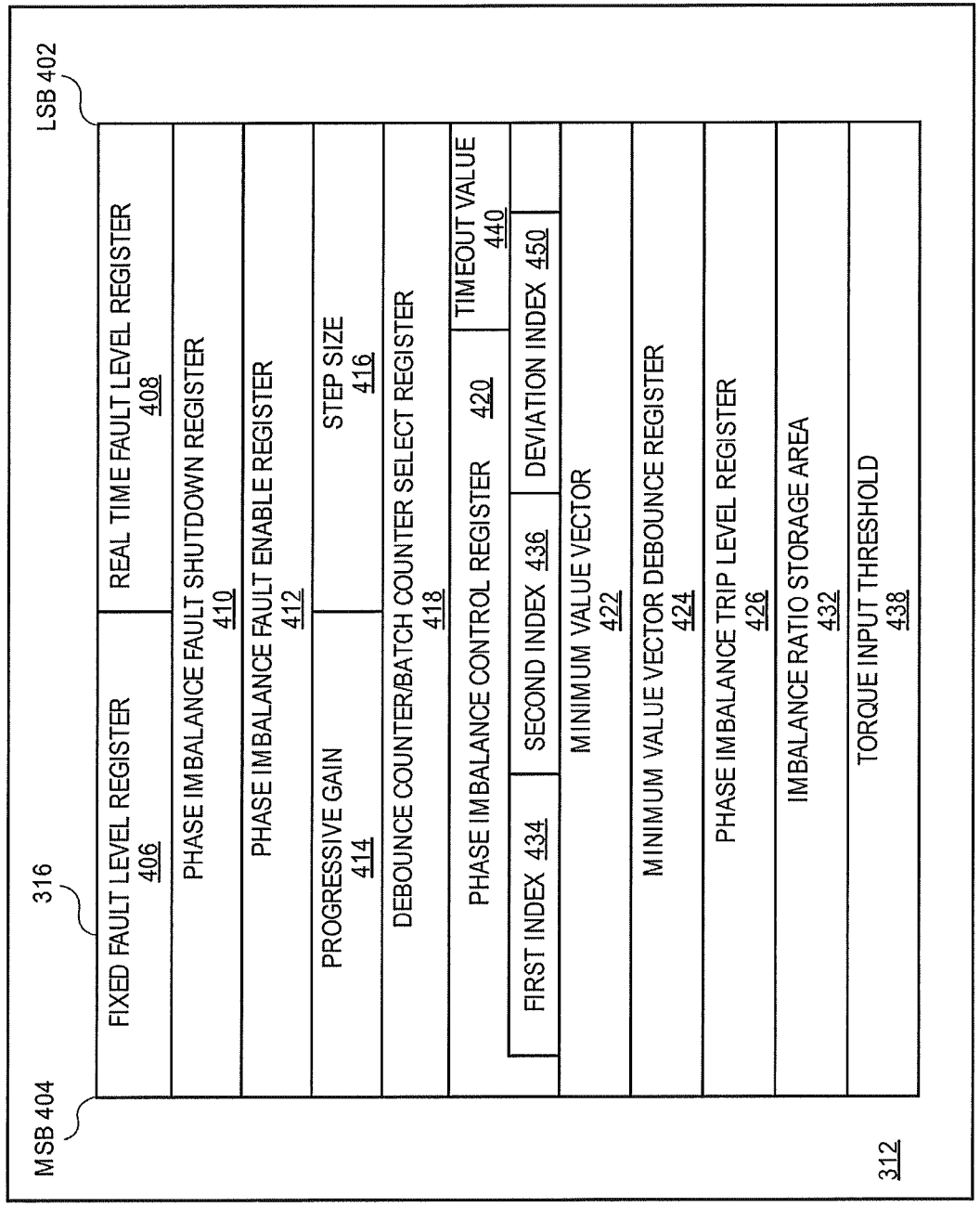
FIG. 5 illustrates exemplary arrangement of various registers in a memory of the electronic controller unit of FIG. 4, in accordance with an aspect of this disclosure.

Referring to FIG. 5, the register map 316 stored in the memory 312 is illustrated, in accordance with an aspect of this disclosure. The term "register map" is generally referred to specific storage areas within the memory 312 that are addressable and accessible to the processor 308 and/or the PLC 310, and may be interchangeably referred to as a "register area" or "registers," as will be understood by one of ordinary skill in the art in view of this disclosure. The register map 316 includes a plurality of registers or storage areas configured to store variables or parameters as binary values starting from a least significant bit (LSB) 402 to a most significant bit (MSB) 404. The term "significant" as used with respect to the LSB 402 and the MSB 404 only has a conventional meaning with respect to binary data, and should not be interpreted otherwise, as will be appreciated with one of ordinary skill in the art. Further, a size of the variables stored in the register map 316 may be determined by a range starting from the LSB 402 to the MSB 404, and such a range may be variable. For example, the MSB 404 may correspond to 8-bit, 16-bit, 32-bit, 64-bit, or higher bit positions that may be expressed as a power of the decimal number 2. In FIG. 5, an arrangement of such plurality of variables or parameters is illustrated by way of example only, and not by way of limitation, as different areas within the register map 316 may be used for storage of such variables. The plurality of registers of the register map 316 may have fixed or dynamically changing data. Further, data in the register map 316 may be addressable by respective locations of the data by the processor 308 and/or the PLC 310.

In one aspect, the register map 316 includes a fixed fault level register 406. The fixed fault level register 406 includes bits to indicate a plurality of fault levels associated with the electrical component 204 to the processor 308. For example, the fixed fault level register 406 may include bits set to binary '1' or '0' that indicate whether or not specific fault levels associated with the plurality of phases 204a-204c have occurred. The term "fault level" may refer to an acceptable/tolerable numerical value of the electrical parameter being measured by the electrical parameter measurement device 212 and provided to the electronic controller unit 222, as further discussed with respect to FIG. 6. Such a numerical value indicates to the processor 308 that a potential fault may exist or has occurred in the electrical component 204 and/or the machine 100, in general.

Likewise, in one aspect, the register map 316 includes a real time fault level register 408 indicating to the processor 308 in real-time which fault level for the plurality of phases 204a-204c tripped or has occurred based on the electrical parameter value in the input vector 302. The term "real time" refers to a time period when the machine 100 is operating and the plurality of phases 204a-204c are generating various electrical parameter values measured by the electrical parameter measurement device 212. For example, the real time fault level register 408 may provide one bit per fault level. A fault level may be identified by the processor 308 using a position of a bit of the real time fault level register 408 where a number corresponding to a position of the bit in the real time fault level register 408 identifies the fault level. When the bit's position in the real time fault level register 408 is set to a binary '1', a fault corresponding to that bit's position is deemed to have occurred and when set to a binary '0', the processor 308 may indicate no fault with the electrical component 204 for the fault level corresponding to the bit's position.

In one aspect, the register map 316 includes a phase imbalance fault shutdown enable register 410. When a bit of the phase imbalance fault shutdown enable register 410 is set to a binary '1', the phase imbalance fault shutdown enable register 410 may indicate to the processor 308 that the electrical component 204 or the machine 100 may be shut down, with the shutdown enable vector 336 being applied by the processor 308 to start a shutdown routine. When set to a binary '0', the processor 308 may that no phase imbalance was detected, as discussed with respect to FIG. 6. A position of the bit ('0' or '1') within the phase imbalance fault shutdown enable register 410 indicates a fault level of the electrical component 204 to the processor 308 that caused the processor 308 to apply the shutdown enable vector 336 or to determine the fault level to be associated with a controls induced imbalance, as also discussed with respect to FIG. 6.

In one aspect, the register map 316 includes a phase imbalance fault enable register 412 in which each bit is allocated to a fault level that may be enabled for inclusion as one of the levels in the threshold vector 330. When a bit in the phase imbalance fault enable register 412 is set to a binary '1', the phase imbalance fault enable register 412 may indicate to the processor 308 that a fault level identified by the position of the bit is to be enabled for that fault level. Likewise, when a bit in the phase imbalance fault enable register 412 is set to a binary '0', the phase imbalance fault enable register 412 may indicate to the processor 308 that a fault level identified by the position of the bit is to be disabled for that fault level.

In one aspect, the register map 316 includes a progressive gain 414. The progressive gain 414 is a weighting factor applied to the imbalance ratio 324 in the memory 312 to generate a step size 416 for the counter 318. The progressive gain 414 may be stored in the progressive gain buffer 326 and multiplied with the imbalance ratio 324 by the processor 308 to obtain the step size 416 (stored in the step size buffer 328). By way of example only, when the progressive gain 414 is set to a value of zero, the step size 416 has a numerical value of 1. The step size 416 may then be used by the processor 308 to adjust the counter 318 to allow for faster counting as a phase imbalance of the plurality of phases 204a, 204b, and 204c detected by the processor 308 becomes greater. Such adjustment of the step size 416 may be carried out in real time for every cycle or may be carried out after the machine 100 has been run based on usage data of the machine 100. For example, the progressive gain 414 may be adjusted by the processor 308 based upon a high value of the phase imbalance indicating that the counter 318 may need to count faster thereby increasing the step size 416. Likewise, if the detected phase imbalance is going down or becoming negative, the counter 318 may need to count slower, and the step size 416 is reduced.

In one aspect, the register map 316 includes a debounce counter/batch counter select register 418. The debounce counter/batch counter select register 418 provides a configuration to select between debounce or batch counting implemented by the debounce counter 320 and the batch counter 322, respectively, in the memory 312. Again, each bit in the debounce counter/batch counter select register 418 corresponds to a fault level. For each fault level, a binary '0' bit corresponds to using the debounce counter 320 and a binary '1' bit corresponds to using the batch counter 322, and the counter 318 implements the counting process accordingly under control of the processor 308 based on which fault level is active. When the debounce counter 320 is used, count will clear or reset instead of decreasing. When the debounce counter 320 is selected, the debounce counter 320 is configured to count up whenever a fault condition exists or is detected. When the batch counter 322 is used, count will be increased during a fault condition to the fault level and decreased or down counted during a non-faulted condition to zero. When a fault has occurred for a particular fault level, the batch counter 322 may be cleared at zero. It will be appreciated that other techniques of counting may equally be applicable without departing from the scope of this disclosure.

A fault condition is considered removed or not existing anymore once the count returns to zero for the batch counter 322. For the debounce counter 320, the fault is considered removed when the fault condition has not existed for a debounce time implemented by the debounce counter 320 (e.g., a time taken by the debounce counter 320 to count up from a count of 0 to a count of 100). That is, the fault has to be present for the continuous amount of time specified by the debounce time of the debounce counter 320 to be declared an actual fault, and the debounce counter 320 may not be allowed to reset for the continuous amount of time specified by the debounce time to be declared fault free.

In one aspect, the register map 316 includes a phase imbalance control register 420. The phase imbalance control register 420 includes bits for a first index 434, a second index 436, a deviation index 450, and a timeout value 440. The first index 434 is associated with identifying a first phase (e.g., one of the plurality of phases 204a, 204b, and 204c) in the plurality of phases 204a, 204b, and 204c that has an electrical parameter value different from a predefined maximum electrical parameter value in the input vector 302, as compared with a previous cycle, or a previous value of the input vector 302, as discussed with respect to FIG. 6. When the first index 434 is a binary '0', the counter 318 is unaffected and when the first index 434 is a binary '1', the counter 318 is forced to decrease by changing the phase identified as having the electrical parameter value at a maximum, different from the phase identified in the previous cycle.

Figure 6:
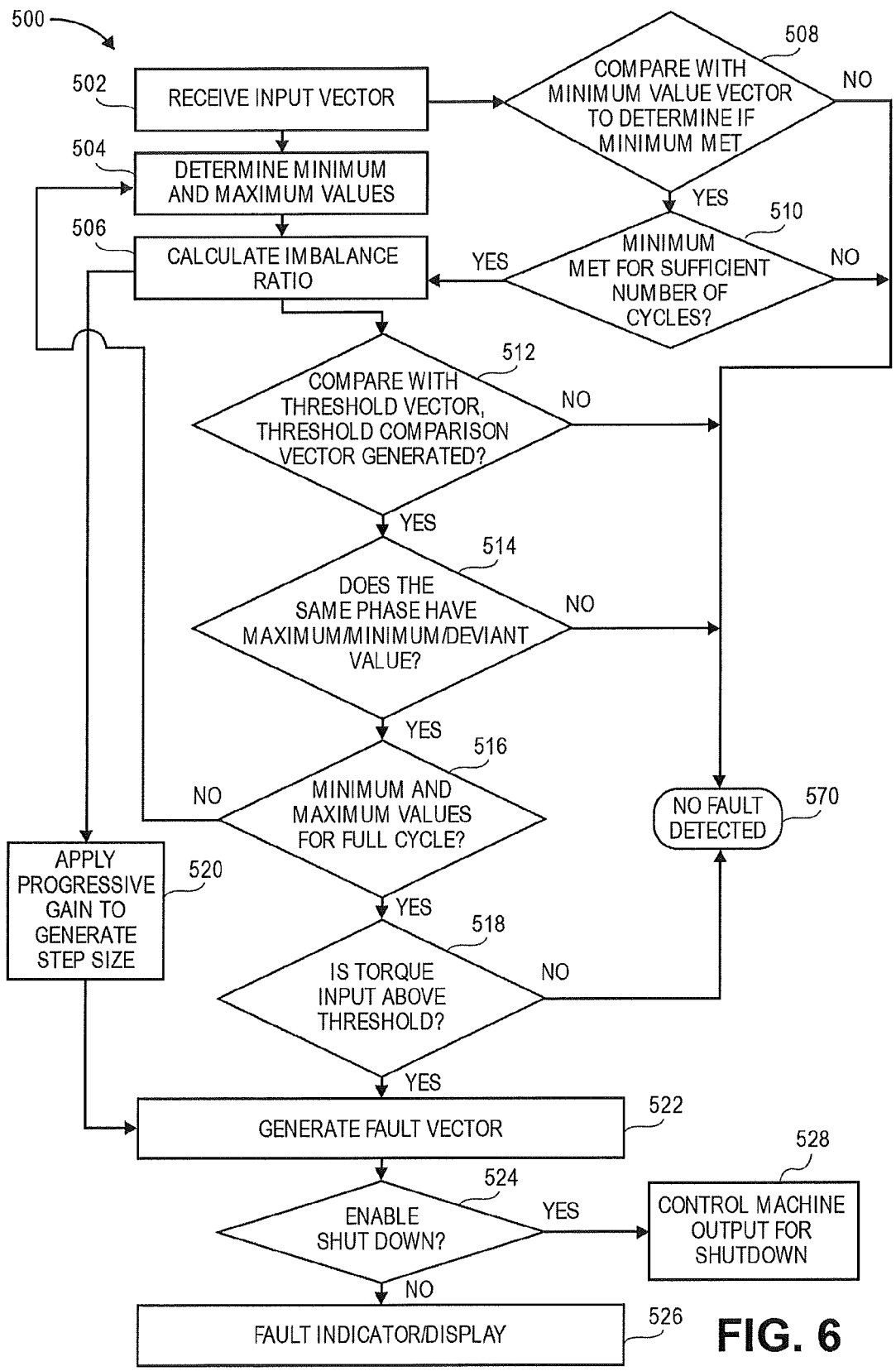
FIG. 6 illustrates a flowchart for a method to detect phase imbalance of an electrical component of the machine of FIGS. 1 and 2, in accordance with an aspect of this disclosure.

Likewise, the second index 436 is associated with identifying a second phase (e.g., one of the plurality of phases 204a, 204b, and 204c) in the plurality of phases 204a, 204b, and 204c that has an electrical parameter value different from a predefined minimum electrical parameter value in the input vector 302, as compared with a previous cycle, or a previous value of the input vector 302, as also discussed with respect to FIG. 6. When the second index 436 is a binary '0', the counter 318 is unaffected and when the second index 436 is a binary '1', the counter 318 is forced to decrease by changing the phase identified as having the electrical parameter value at a minimum, different from the phase identified in the previous cycle.

The deviation index 450 identifies a phase in the plurality of phases 204a, 204b, and 204c that has a value of the electrical parameter in the input vector 302 deviating from a predefined value stored in the memory 312. The timeout value 440 is used to determine whether a complete cycle for the electrical component 204 has occurred. For example, if the timeout value 440 is a binary '0', the processor 308 knows that the counter 318 should be unaffected and continue counting as the input vector 302 for a complete current cycle has not been received yet. When the timeout value 440 is a binary '1', the counter 318 is forced to decrease to a zero value indicating that the complete cycle has been monitored. The timeout value 440 may be controlled by the timer 314.

According to the various aspects of the disclosure, the processor 308 is configured to use one or more of the first index 434, the second index 436, and the deviation index 450 to identify the phase causing the phase imbalance. For example, in one aspect, only the first index 434 is used to identify the phase in the plurality of phases 204a, 204b, and 204c having a maximum electrical parameter value as a criterion for detecting phase imbalance. Likewise, in another aspect, the processor 308 may only use the second index 436 as a criterion to identify the phase in the plurality of phases 204a, 204b, and 204c having a minimum electrical parameter value to detect the phase imbalance. In yet another aspect, only the deviation index 450 may be used as a criterion to detect phase imbalance. The processor 308 is configured to independently turn on or off each of the first index 434, the second index 436, and the deviation index 450 as the criterion of choice for different cycles. In still another aspect, the first index 434, the second index 436, and the deviation index 450 may not be used at the same time (or, for the same cycle) by the processor 308. Bits for each of the first index 434, the second index 436, and the deviation index 450 may be enabled dependent on an input time of the input vector 302. Such bits may be stored in the register maps 316 or elsewhere in the memory 312. For example, for peak currents measured by the electrical parameter measurement device 212, the first index 434 might be used as a check or as a criterion by the processor 308 to detect the phase imbalance, but for RMS currents, the second index 436 might be used as a check by the processor 308.

In one aspect, the register map 316 includes a minimum value vector 422. The minimum value vector 422 stores minimum levels of the electrical parameter values in the input vector 302 for the processor 308 to consider a phase imbalance. The minimum value vector 422 may include minimum threshold values for peak and root mean square (RMS) values of the electrical parameters for each of the plurality of phases 204a, 204b, and 204c of the electrical component 204. In conjunction with the minimum value vector 422, the register map 316 includes a minimum value vector debounce register 424 storing a minimum count for which the input vector 302 should continuously be above the values stored in the minimum value vector 422 before the processor 308 considers a phase imbalance. This minimum count may be implemented using the counter 318. The minimum value vector 422 may include a plurality of minimum values such that only one, more than one or all of the minimum values have to be met by the input vector 302 for the processor 308 to consider a phase imbalance.

In another aspect, the minimum value vector 422 may include minimum values for more than one input vectors at a time. In this aspect, the minimum value vector 422 may be a matrix of vectors in which each row of the matrix corresponds to an input vector (including the input vector 302). The minimum value vector 422 may then provide minimum values that have to be met as a minimum value threshold for only the input vector 302, the input vector 302 and additional input vectors, or for all input vectors including the input vector 302 received at the electronic controller unit 222.

In one aspect, the register map 316 includes a phase imbalance trip level register 426. The phase imbalance trip level register 426 may include values for the threshold vector 330 for comparison with the imbalance ratio 324, as discussed with respect to FIG. 6.

In one aspect, the register map 316 may include an imbalance ratio storage area 432 to store the imbalance ratio 324 calculated by the processor 308, as discussed with respect to FIG. 6. The register map 316 further includes additional space for storing various variables, for example, a torque input threshold 438 that indicates to the processor 308, a minimum torque value output by the electrical component 204 below which the input vector 302 is invalid.

INDUSTRIAL APPLICABILITY

The present disclosure is applicable to electrical components and systems (e.g., the electrical component 204) as a standalone apparatus or as part of a machine (e.g., the machine 100).

Electrical components of machines may have fluctuations in the electrical parameters of one or more phases under normal course of operation. Such fluctuations may cause a phase imbalance, which is monitored to determine if an electrical component has failed or if the machine needs to be shut down.

Conventionally, detection of such phase imbalance is deemed as a failure of a component in the machine, and may require immediate attention of an operator of the machine. More often than not, the operator has to shut down the machine for verifying a reason behind the phase imbalance, troubleshooting and/or repairing a presumed failure behind the phase imbalance. However, in many scenarios, such phase imbalance is due to controls induced phenomena, which are not true faults or failures of components in the machine. Even when the phase imbalance due to such controls induced phenomena are not true faults, conventional systems misidentify the phase imbalance to be a fault in the machine and require shut down of the machine incurring expensive downtimes and causing potential delays in the project for which the machine was deployed.

Various aspects of this disclosure solve the complex problem of differentiating false alarms of detected phase imbalance or malfunction of the electrical component 204 from actual faults causing the phase imbalance, and improve optimal utilization of the machine 100 by reducing or avoiding interruptions in operating the machine 100. In this respect, various aspects of this disclosure add significantly more to an improved functioning of the electronic controller unit 222 in the machine 100 that makes a determination of whether or not there is a true fault in the machine 100 requiring a shutdown of the machine 100.

Referring to FIG. 6, there is illustrated a method 500 for detecting a phase imbalance of the electrical component 204 in the machine 100, and for determining whether such a phase imbalance is a false alarm or is due to an actual fault in the machine 100 is illustrated, in accordance with an aspect of this disclosure. FIG. 6 presents the method 500 as a flow diagram, although the method 500 may be understood using other types of presentations such as process diagrams, graphs, charts, equations, etc. In one aspect, one or more processes or operations in the method 500 may be carried out by the electronic controller unit 222 inside the machine 100. For example, the one or more processes or operations may be carried out by the processor 308 inside the electronic controller unit 222, using the input vector 302 and the controls input 224, and executing the computer executable instructions 338 stored in the memory 312 of the electronic controller unit 222. As discussed, the input vector 302 and the controls input 224 may be received at the electronic controller unit 222 and processed by the processor 308 while the machine 100 is in use or is in operation in a work environment. In another aspect, in the method 500, one or more processes or operations, or sub-processes thereof, may be skipped or combined as a single process or operation, and a flow of processes or operations in the method 500 may be in any order not limited by the specific order illustrated in FIG. 6. For example, one or more processes or operations may be moved around in terms of their respective orders, or may be carried out in parallel. The term "flow" generally refers to a logical progression of operations in an exemplary manner carried out by the processor 308 and other components of the electronic controller unit 222. However, such a flow is by way of example only and not by way of limitation, as at a time, the flow may proceed along multiple operations or processes of the method 500. Further, the method 500 may be carried out by the electronic controller unit 222 for other electrical components in the machine 100 and is not limited to the electrical component 204. The method 500 may be implemented by the processor 308 in a high level or a low level programming language (e.g., C++, assembly language, etc.) using the PLC 310 and by executing the computer executable instructions 338 in the memory 312.

The method 500 may begin in an operation 502 in which the input vector 302 is received at the electronic controller unit 222. The electronic controller unit 222 may receive the input vector 302 after filtering and digital signal processing by the DSP 218. Alternatively, the electronic controller unit 222 may receive the input vector 302 directly from the electrical parameter measurement device 212. The input vector 302 includes numerical values of the electrical parameters measured by the electrical parameter measurement device 212 for each of the plurality of phases 204a, 204b, and 204c of the electrical component 204. Additionally or alternatively, the electronic controller unit 222 may receive input vectors for other additional electrical components in the machine 100. The electrical parameter values in the input vector 302 may be in a binary or a decimal format. If in the decimal format, the electrical parameter values may be converted to binary for storage as the input vector copy 303 in the memory 312, which is then processed by the processor 308. For ease of discussion, the input vector 302 will be presented as including the electrical parameter values in the decimal format. In one aspect, a plurality of input vectors, including the input vector 302, may be received at the electronic controller unit 222.

The input vector 302 may include electrical parameter values corresponding to peak or RMS current, peak or RMS voltage, and/or peak or RMS magnetic flux, although the method 500 may be performed by the processor 308 using instantaneous values of electrical parameters as well. When the plurality of phases 204a, 204b, and 204c are functioning normally, each of the plurality of phases 204a, 204b, and 204c will generate respective electrical parameter values. For example, under normal operation, the input vector 302 may be an array or a vector of peak currents indicated as [1000 A, 1010 A, 990 A] with each of the plurality of phases 204a, 204b, and 204c drawing substantially equal amounts of peak or RMS current (e.g., in Ampere units (A)). In this example, a first value (1000 A) in the input vector 302 may be a peak or an RMS value in the phase 204a, a second value (1010 A) in the input vector 302 may be a peak or an RMS value in the phase 204b, and a third value (990 A) in the input vector 302 may be a peak or an RMS value in the phase 204a. The plurality of phases 204a, 204b, 204c are then indicated as having a 10% phase imbalance since the first value, the second value, and the third value are, for example within 10% of each other. Similarly, each of the plurality of phases 204a, 204b, and 204c may have equal or substantially equal values of peak or RMS voltage or magnetic flux. In this scenario, the plurality of phases 204a, 204b, and 204c are substantially balanced, that is, there is no phase imbalance detected by the electronic controller unit 222. Such a scenario may exist, for example, when the machine 100 is in an idling mode or is outputting a constant power to the implement 106.

However, there are scenarios when the input vector 302 may include substantially unequal values of the electrical parameters measured by the electrical parameter measurement device 212. In one aspect, such scenarios may exist due to a controls induced imbalance when the controls input 224 is provided to the electronic controller unit 222. The controls input 224 may arise from operation of the machine 100 by an operator. For example, the machine 100 may need to increase electrical power drawn from the electrical component 204 to accelerate the drive wheels 108 or to move the implement 106. In this example, one or more of the plurality of phases 204a, 204b, and 204c may draw a higher current, higher voltage or higher magnetic flux causing the phase imbalance. In another aspect, when there is a fault in the electrical component 204 (e.g., due to a loose connection or a reduced winding impedance to ground or another winding due to an insulation failure), one of the plurality of phases 204a, 204b, and 204c will draw a higher/lower current, a lower/higher voltage or a higher/lower magnetic flux causing the phase imbalance. In such phase imbalance scenarios, for a given cycle, the input vector 302 may include unequal electrical parameters. For example, the input vector 302 may have peak currents indicated by current values [1000 A, 800 A, 990 A]. In this example, the second value of 800 A corresponding to the second phase 204b has fallen below a normal balanced phase value (e.g., 10%). In yet another example, the input vector 302 received at the electronic controller unit 222 may include electrical parameter values [1220 A, 990 A, 1000 A], such that the first value corresponding to the first phase 204a is substantially higher than expected. Again, the electronic controller unit 222 may determine a phase imbalance of 20%, which may be unacceptable. It will be appreciated that the numerical values used in this disclosure are by way of example only and not by way of limitation, as other deviations from expected electrical parameter values for the plurality of phases 204a, 204b, and 204c may exist.

Various aspects of this disclosure are directed to the electronic controller unit 222 determining whether the phase imbalance is due to a controls induced imbalance in the machine 100 or due to an actual fault in the electrical component 204 of the machine 100. Therefore, the electronic controller unit 222 will not immediately shut down the machine 100 when a phase imbalance is detected (e.g., due to a variation in the electrical parameters of the electrical component 204). Rather, the electronic controller unit 222 applies one or more of a plurality of conditions, as discussed with respect to operations 506-518 to differentiate a false alarm of a phase imbalance (e.g., controls induced phase imbalances) from actual faults causing such a phase imbalance in the machine 100. With respect to the plurality of conditions, it will be appreciated that the adjectives "first", "second", "third", "fourth" and "fifth" are merely used to distinguish one aspect of the plurality of conditions from another, and should not be understood to be associated with any particular order or priority in which the plurality of conditions may be applied, as will be understood by one of ordinary skill in the art reading this disclosure.

In an operation 504, the electronic controller unit 222 determines a minimum value and a maximum value of the electrical parameter values in the input vector 302 (also referred to herein as minimum electrical parameter values and maximum electrical parameter values, respectively). Such determination of the minimum value and the maximum value in the input vector 302 may be carried out by the processor 308 by comparing each value in the input vector 302 against the other values therein. The minimum value ("Min") and the maximum value ("Max") in the input vector 302 may be stored in the memory 312, e.g., in a register in the register map 316. As such, the minimum and maximum values may be used by the processor 308 for detecting the phase imbalance in the plurality of phases 204a, 204b, and 204c.

In an operation 506, the processor 308 may calculate the imbalance ratio 324 for the plurality of phases 204a, 204b, and 204c. In one aspect of this disclosure, the imbalance ratio 324 may be determined by the processor 308 by calculating an expression (1−Min/Max) for the input vector 302. A ratio Min/Max refers to a balance ratio of the plurality of phases 204a, 204b, and 204c and therefore, (1−Min/Max) provides the imbalance ratio 324. The imbalance ratio 324 may be calculated for current values (in Amperes) in the input vector 302 as one or more of: a first ratio including a minimum peak current to a maximum peak current in each of the plurality of phases 204a, 204b, and 204c using an expression $(1-\text{Min}_{Peak\text{-}current}/\text{Max}_{Peak\text{-}current})$, or a second ratio including a minimum root mean square (RMS) current to a maximum root mean square (RMS) current in each of the plurality of phases 204a, 204b, and 204c using an expression $(1-\text{Min}_{RMS\text{-}current}/\text{Max}_{RMS\text{-}current})$. Likewise, the imbalance ratio 324 may be calculated for magnetic flux values in the input vector 302 as one or more of: a third ratio including a minimum peak magnetic flux to a maximum peak magnetic flux in each of the plurality of phases 204a, 204b, and 204c using an expression $(1-\text{Min}_{Peak\text{-}flux}/\text{Max}_{Peak\text{-}flux})$, or a fourth ratio including a minimum peak magnetic flux to a maximum peak magnetic flux in each of the plurality of phases 204a, 204b, and 204c using an expression $(1-\text{Min}_{RMS\text{-}flux}/\text{Max}_{RMS\text{-}flux})$. The first ratio, the second ratio, the third ratio, and the fourth ratio may be stored by the processor 308 in the memory 312 of the electronic controller unit 222. Similar ratios may be calculated by the processor 308 for other electrical parameters such as peak and/or RMS voltages across the plurality of phases 204a, 204b, and 204c. The operations of division and subtraction to calculate the imbalance ratio 324 may be carried out by the processor 308 using the PLC 310. The imbalance ratio 324 may be stored, for example, in the imbalance ratio storage area 432 in the register map 316 of the memory 312.

As an example, the input vector 302 may be received as having electrical parameter values [1000 A, 600 A, 900 A] for the phase 204a, the phase 204b, and the phase 204c, respectively. In this example, Min=600 A and Max=1000 A. Therefore, the imbalance ratio 324 is equal to (1−600/1000)=0.4 (or, 40% when expressed as a percentage). As discussed, the imbalance ratio 324 may be stored in the imbalance ratio storage area 432.

In an operation 508, as a first condition, the processor 308 may compare the values of the electrical parameters in the input vector 302 with the minimum value vector 422 stored in the register map 316 of the memory 312 to determine if the minimum values required for the processor 308 to consider the phase imbalance have been met. Such minimum values may vary from machine to machine, from electrical component to electrical component, and for different failure modes (cascading failure mode to catastrophic failure mode) of the same electrical component 204. For example, if the input vector 302 has electrical parameter values lower than the values stored in the minimum value vector 422, the electronic controller unit 222 may, in an operation 570, determine that the input vector 302 is not associated with an actual fault and look for another instance of the input vector 302 in a subsequent cycle to verify such a determination. Such low values in the input vector 302 may be the result of the machine 100 not drawing sufficient electrical power from the electrical component 204, e.g., when the machine 100 is in an idling mode. However, if the input vector 302 has values of the electrical parameters at levels greater than values in the minimum value vector 422, the flow proceeds to an operation 510. In one aspect, the input vector 302 may include a plurality of minimum values such that only one, more than one or all of the minimum values have to be met by the input vector 302.

In another aspect, the minimum value vector 422 may include minimum values for more than one input vectors at a time. In this aspect, the minimum value vector 422 may be a matrix of vectors in which each row of the matrix corresponds to an input vector (including the input vector 302). The minimum value vector 422 may then provide minimum values that have to be met as a minimum value threshold for only the input vector 302, the input vector 302 and additional input vectors, or for all input vectors including the input vector 302 received at the electronic controller unit 222. In this aspect, the processor 308 verifies that not just the input vector 302 meets the minimum value threshold, but additional or all of the input vectors received at the electronic controller unit 222 are greater than the minimum value vector 422. Further, the processor 308 may check the first condition for not only one cycle, but also for additional cycles or more than one cycle.

In an operation 510, once the input vector 302 has been determined to be above the minimum value vector 422, the processor 308 determines whether the input vector 302 is above the minimum value vector 422 for a predefined number cycles. Such predefined number of cycles may be implemented using the counter 318 counting for a predefined number of counts. For example, the counter 318 may start counting up from zero when the input vector 302 is first received by the processor 308, and may continue counting up to when one cycle has passed. If at the end of the cycle, the input vector 302 is still greater than the minimum value vector 422, the processor 308 sets a bit in the minimum value vector debounce register 424 of the register map 316. Such setting of the bit in the minimum value vector debounce register 424 indicates that the first condition has been met, and the flow proceeds to a second condition in an operation 512, though other techniques of indicating may be used (e.g., setting flags in the register map 316).

However, if the electrical parameter values in the input vector 302 fall below the values in the minimum value vector 422, the input vector 302 is deemed to have failed the first condition and the operation 570 is carried out where the processor 308 indicates that for the current cycle, there is no actual fault. For example, such a scenario may exist when the machine 100 is brought back into an idling mode and the temporarily high values of the electrical parameters in the input vector 302 are indicated by the processor 308 as a false alarm to the display 226 from the output port 306. In another example, such a scenario may exist when the controls input 224 indicates an increase in an output power of the machine 100 or a sudden acceleration of the set of drive wheels 108, which may cause the electrical parameter values to increase or decrease at a high rate, which may be reflected by the input vector 302 having higher than expected electrical parameter values for the plurality of phases 204a, 204b, and 204c. It will be appreciated that the operation 510 may be carried out at any time by the processor 308 while the machine 100 is in use. For example, the operation 510 may be carried out before or in parallel with the operation 504 by the processor 308.

In the operation 512, as a second condition, the imbalance ratio 324 calculated in the operation 506 is compared with the threshold vector 330 stored in the memory 312. The threshold vector 330 may include a plurality of threshold values for the imbalance ratio 324. In one aspect, the threshold vector 330 may include a plurality of threshold trip levels from the phase imbalance trip level register 426 that the imbalance ratio 324 must exceed for the second condition to be met. For example, a lower threshold value in the threshold vector 330 may allow for a low level check to be applied to the imbalance ratio 324 which is outputted from the output port 306 simply as a warning on the fault indicator 228. Likewise, when an upper threshold value in the threshold vector 330 is tripped or exceeded, the processor 308 may initiate a shutdown of the machine 100 via the control switch 230 indicating a significant fault. Further, a middle threshold value when met by the imbalance ratio 324 may indicate a fault type that can be temporarily be considered as not a serious fault but if persistent for a longer period of time, may initiate shut down of the machine 100. Additional threshold levels for various failure modes of the electrical component 204 that may affect operation of the machine 100 may be included in the threshold vector 330. If any of the threshold vector 330 values are tripped, as indicated by the phase imbalance trip level register 426, the threshold comparison vector 332 is generated. The threshold comparison vector 332 has at least one non-zero value to indicate that at least one of the fault trip levels in the phase imbalance trip level register 426 was exceeded by the imbalance ratio 324 and the second condition for determining that the phase imbalance detected was due to an actual fault in the machine 100 was met, and the flow proceeds to an operation 514.

However, if the imbalance ratio 324 was not above any of the fault trip levels in the phase imbalance trip level register 426, the threshold comparison vector 332 may not be generated (or, may contain all zero values) and the phase imbalance for the input vector 302 for the current cycle is not associated with an actual fault, per the operation 570. Again, in the operation 570, the processor 308 indicates that the phase imbalance detected in the current cycle is due to a controls induced phase imbalance and is not due to an actual fault. As a numerical example, the threshold vector 330 may include a range of values including the lower threshold value, the middle threshold value, the higher threshold value, and additional intermediate threshold values. The imbalance ratio 324 may fall between 0-0.2, 0.2-0.4, 0.4-0.6, 0.6-0.8, or 0.8-1.0, although the ranges may have other threshold values and may not be evenly or uniformly distributed or have equal sizes. These ranges may be expressed in the threshold vector 330 as [0, 0.2, 0.4, 0.6, 0.8, 1.0]. In this respect, the processor 308 may determine that the third condition has been met when the imbalance ratio 324 is above 0.4, for example. The processor 308 may accordingly generate the threshold comparison vector 332 to show where the imbalance ratio 324 fell in the ranges, e.g., by indicating a binary value associated with a difference between the imbalance ratio 324 and 0.4, though other types of indication may be used.

In another example, a position of the range in the threshold vector 330 may be output to the threshold comparison vector 332 when the imbalance ratio 324 is above a certain range (e.g., above 0.2), and the like. For example, when the imbalance ratio 324 is 0.3, the threshold comparison vector 332 may then be equal to a binary [01000] indicating that the imbalance ratio 324 fell in the second range corresponding to 0.2-0.4 and indicated as a binary '1' in the threshold comparison vector 332. Likewise, a size of the threshold vector 330 and the threshold comparison vector 332 may vary depending on various values of the imbalance ratio 324 generated in different scenarios (e.g., different machines, different failure modes, etc.). The threshold comparison vector 332 is generated with at least one non-zero value to indicate to the processor 308 that the second condition in the operation 514 is met.

In an operation 514, a third condition is applied to the input vector 302 where the processor 308 checks whether a phase in the plurality of phases 204a, 204b, 204c that was identified as the phase with the maximum electrical parameter value in the operation 504 is the same as a phase identified with having a maximum electrical parameter value for one or more previous cycles for which the input vector 302 was received by the electronic controller unit 222. Likewise, the processor 308 determines whether a phase in the plurality of phases 204a, 204b, 204c that was identified as the phase with the minimum electrical parameter value in the operation 504 is the same as a phase identified with having a minimum electrical parameter value for one or more previous cycles for which the input vector 302 was received by the electronic controller unit 222. In one aspect, the processor 308 stores the first index 434 in the register map 316 identifying a first phase in the plurality of phases 204a, 204b, and 204c that has an electrical parameter value different from a predefined maximum electrical parameter value stored in the memory 312 of the electronic controller unit 222. The first index 434 for the input vector 302 is compared against a similar index identifying which phase in the plurality of phases 204a, 204b, and 204c had the maximum electrical parameter value for a previous cycle. As a numerical example, when the input vector 302 is equal to [1200 A, 1000 A, 1000 A], the first index 434 may be equal to 1 indicating that the phase 204a may have a fault condition.

Similarly, the second index 436 in the register map 316 identifying a second phase in the plurality of phases 204a, 204b, and 204c that has an electrical parameter value different from a predefined minimum electrical parameter value stored in the memory 312 of the electronic controller unit 222. The second index 436 for the input vector 302 is compared against a similar index identifying which phase in the plurality of phases 204a, 204b, and 204c had the minimum electrical parameter value for a previous cycle.

In another aspect, the processor 308 may generally allocate the deviation index 450 associated with the plurality of phases 204a, 204b, and 204c identifying which one of the plurality of phases 204a, 204b, and 204c had a deviation from a normal electrical parameter value for a current cycle for which the input vector 302 was received. In this aspect, the processor 308 may not particularly look for identifying a phase in the plurality of phases 204a, 204b, and 204c that has a maximum or a minimum value, but may look for a deviation in the electrical parameter values among the plurality of phases 204a, 204b, and 204c beyond an acceptable deviation. For example, a magnitude of the deviation may be indicated to meet a fault level in the fixed fault level register 406, the real time fault level register 408, or both. Alternatively, the processor 308 may obtain acceptable values of such a deviation from a memory location (not shown) in the memory 312.

Again, as an example, if the input vector 302 is expected to have all values substantially near 1000 A (e.g., [1002 A, 1101 A, 999 A] but has one value at a deviation of more than 25% (e.g., [1000 A, 1330 A, 999 A]), the deviation index 450 may identify a phase in the plurality of phases 204a, 204b, and 204c to have the deviation (e.g., phase 204b in this case). In one aspect, the deviation index 450 may be stored as a vector itself where a binary '0' for a phase indicates that that phase is functioning alright, but the phase(s) having a corresponding bit as binary '1' may be in a failure mode or has a fault. For example, the deviation index 450 may be equal to [001] indicating that the third phase 204c may have a problem, which needs to be verified by the processor 308 using the plurality of conditions discussed in the method 500.

Still in the operation 514, the processor 308 determines whether the third condition is met by checking whether the first index 434, the second index 436, or the deviation index 450 have not changed for the plurality of phases 204a, 204b, and 204c for the current electrical cycle, when compared with respect to the previous cycle. In one aspect, one of the first index 434, the second index 436, or the deviation index 450 may be compared with respective indices in a plurality of previous cycles or may be stored in the memory 312 for comparison with future one or more cycles to determine if the phase(s) in the plurality of phases 204a, 204b, and 204c is the same phase that has a maximum, or a minimum, or a deviant value from a normal or expected electrical parameter value of the electrical parameter in the input vector 302. If the first index 434, the second index 436, or the deviation index 450 have changed, the processor 308 determines that the detected phase imbalance is a controls induced imbalance or is not due to an actual fault in the machine 100, with the flow proceeding to the operation 570. However, if the first index 434, the second index 436, or the deviation index 450 have not changed for one or more previous cycles, then the third condition is met and the flow proceeds to an operation 516. At a time, the processor 308 may pick only one of the first index 434, the second index 436, or the deviation index 450 as the criterion to be checked to determine if the third condition has been met.

For example, if the same phase in the plurality of phases 204a, 204b, and 204c consistently has a maximum electrical parameter value, it may be an indication of a short circuit in the electrical component 204 causing the same phase to consistently have a deviation over two or more cycles. The processor 308 may use the first index 434, the second index 436, and the deviation index 450 independently at different times (for different cycles). Alternatively, the first index 434, the second index 436, and the deviation index 450 may be checked by the processor 308 at the same time (for a single cycle) depending upon what types of measurements (peak/RMS) are being made by the electrical parameter measurement device 212.

In the operation 516, as a fourth condition, the processor 308 determines if the peak or the RMS electrical parameter values obtained in the operation 504 are synchronized with a start and an end of the cycle. Such synchronization lets the processor 308 reject any values noted as maximum or minimum values before a complete cycle is over as a true maximum or minimum may not have occurred yet for a particular cycle until that cycle is over. If electrical parameter values in the input vector 302 are utilized prior to a cycle being complete, the phase imbalance detected by the processor 308 may be inaccurate as a higher value or a lower value of the electrical parameter may occur later in the same cycle.

To make such a determination, the processor 308 obtains a timeout value 440 from the phase imbalance control register 420 to determine whether maximum electrical parameter value and the minimum electrical parameter value in the input vector 302 were calculated for an entire cycle. The timeout value 440 indicates to the processor 308 for how long an acquisition of the input vector 302 should occur at the input port 304. The processor 308 may compare the timeout value 440 with a value of the counter 318 and may accordingly increment or decrement the counter 318. When the counter 318 is equal to the timeout value 440, a complete cycle is indicated to the processor 308 and the fourth condition is met. If the fourth condition is not met, the processor 308 may execute the operation 504 again and continue to do so until the fourth condition is met and a true maximum or minimum electrical parameter value has been identified. When the fourth condition is met, an operation 518 is carried out by the processor 308.

In the operation 518, the processor 308 obtains a torque output of the machine 100 at the input port 304. As a fifth condition, the processor 308 compares a torque value for the torque output by the machine 100 for the current cycle with the torque input threshold 438 stored in the register map 316. If the torque value received at the input port 304 is below the torque input threshold 438, the processor 308 may obtain the input vector 302 for a new cycle as the fault is due to a controls induced phenomenon per the operation 570 since the measurements of the electrical parameter values made by the electrical parameter measurement device 212 for the plurality of phases 204a, 204b, and 204c may be too low for the processor 308 to make a determination if the phase imbalance detected was a valid determination (or, if the imbalance ratio 324 for that cycle was a valid calculation). However, if the torque value received at the input port 304 is above the torque input threshold 438, the fifth condition is met and the processor 308 determines that the detected phase imbalance, and therefore the calculate imbalance ratio 324 in the operation 506, was valid. The torque output by the machine 100 may be measured by a torque sensor or a speed sensor, or other types of sensors placed at appropriate torque generating parts of the machine 100 (e.g., at the drive wheels 108 and/or an output shaft of the electrical component 204). It will be appreciated that when a torque output of the machine 100 is not available for measurement, or when a sensor measuring the torque is not available for some reason, the electronic controller unit 222 may use a torque command or a torque estimation to verify whether or not the fifth condition has been met. For example, the memory 312 may store estimated torque values for the machine 100 depending on a type of the machine 100 and then check whether the phase imbalance detected by the processor 308 is appropriate for a torque estimate value associated with the machine 100.

In an operation 520, the processor 308 may apply the progressive gain 414 to adjust a duration of the cycle for which the input vector 302 is valid. Such adjustment may be implemented by varying the step size 416 of the debounce counter 320 and/or the batch counter 322, as the case might be. For example, the progressive gain 414 may vary in every cycle for which the input vector 302 is received depending upon whether the phase imbalance detected by the processor 308 is large or small relative to an acceptable phase imbalance as indicated by the imbalance ratio 324. If the detected phase imbalance is too large, the progressive gain 414 may be multiplied by a factor greater than unity with the imbalance ratio 324 to increase the step size 416. Likewise, if the detected phase imbalance is too small, the step size 416 is reduced by selecting the progressive gain 414 to be lower than unity. The progressive gain 414 multiplied by the imbalance ratio 324 may be stored in the imbalance ratio storage area 432 of the register map 316 to determine the step size 416. In one aspect, an underflow protection of the result of multiplication of the progressive gain 414 with the imbalance ratio 324 limits the step size 416 to a minimum value of unity. The step size 416 may then be applied by the processor 308 to the counter 318 for incrementing or decrementing the counter 318 (by selecting, e.g., the debounce counter 320 or the batch counter 322, as the case might be).

In an operation 522, the processor 308 generates the fault vector 334 once the plurality of conditions in the operations 506-518 are met and the step size 416 has been applied to the counter 318. In one aspect, the fault vector 334 is generated only when all the plurality of conditions in the operations 506-518 are met. The processor 308 determines that all the plurality of conditions in the operations 506-518 are met by logically "ANDing" various bits in the register map 316 for each of the plurality of conditions. If the result of such an AND operation is true (or a binary '1'), the processor 308 may determine that all of the plurality of conditions have been met. In an alternative aspect, the processor 308 may carry out the operation 524 if only one, only two, only three, or only four of the plurality of conditions in the operations 506-518 are true or have been met.

In yet another alternative aspect, the processor 308 may include additional conditions not directly associated with the electrical component 204 in making a decision whether the detected phase imbalance as indicated by the imbalance ratio 324 is valid and due to an actual fault in the machine 100 and/or the electrical component 204. For example, such additional conditions may include an indication from the operator of the machine 100 that a control input in the controls input 224 is to be considered as an indication of a fault in the machine 100, and should be attended to or verified as appropriate. Such control input will vary from machine to machine and between different components within the same machine 100. For example, the operator may indicate over the controls input 224 that a particular failure mode of the machine 100 is occurring, and that failure mode is a serious or a cascading type failure mode. A serious failure mode may include, but is not limited to, a sudden and unexpected malfunction of a component in the machine 100, an accident, or the like. A cascading failure may be a failure of a winding insulation of the plurality of phases 204a, 204b, 204c or in the rectifier 206 that may allow the machine 100 to be operated for some time but will eventually cause other components to fail leading to a serious failure in the machine 100. Accordingly, the processor 308 may include all such conditions, in addition to the plurality of conditions in the operations 506-518 before determining whether there is an actual fault causing the phase imbalance detected in the operation 506.

In the operation 524, the processor 308 may determine whether to output the shutdown enable vector 336 over the output port 306. The shutdown enable vector 336 may include values indicating a serious fault or a temporary fault that needs attention of the operator of the machine 100. Such values may be a series of bits, with each bit indicating a fault level.

In an operation 526, the processor 308 determines that the fault causing the phase imbalance in the plurality of phases 204a, 204b, and 204c is due to an actual fault and not due to a controls induced imbalance, the processor 308 may output a signal to the fault indicator 228 and to the display 226. In the operation 526, the processor 308 may not shut down the machine 100 but may continue to receive the input vector 302 for an additional number of cycles to confirm that whether the fault causing the phase imbalance has or has not deteriorated further.

However, in an operation 528, when the processor 308 determines that the shutdown enable vector 336 is output via the output port 306 to activate the control switch 230, the processor 308 may output control signals to control the machine 100 and/or the electrical component 204. The control switch 230 may output signals to control the implement 106 and/or the electrical component 204 to shut down the machine 100. For example, the machine 100 may be controlled to turn off the engine 202 supplying power to the electrical component 204, and/or bringing the machine 100 to a halt. Alternatively, the processor 308 may control the machine 100 by initiating a shutdown procedure or routine stored in the memory 312, and indicate the shutdown to the operator of the machine 100, e.g., on the display 226, and the implement 106 is then no longer operated.

Accordingly, various aspects of this disclosure apply a plurality of conditions discussed with respect to the method 500 to differentiate false alarms of phase imbalance in the machine 100 from an actual fault causing the phase imbalance. Although the method 500 is discussed with respect to the machine 100 and specifically, the electrical component 204 in the machine 100, it will be appreciated that any electric machine for which electrical parameters may be measured will benefit from this disclosure.

It will be appreciated that the foregoing description provides examples of the disclosed system and technique. However, it is contemplated that other implementations of the disclosure may differ in detail from the foregoing examples. All references to the disclosure or examples thereof are intended to reference the particular example being discussed at that point and are not intended to imply any limitation as to the scope of the disclosure more generally. All language of distinction and disparagement with respect to certain features is intended to indicate a lack of preference for those features, but not to exclude such from the scope of the disclosure entirely unless otherwise indicated.

Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context.

We claim:

1. A method for detecting a phase imbalance of an electrical component in a machine due to an actual fault, comprising:
   receiving, at an electronic controller unit of a machine, an input vector having electrical parameter values associated with a plurality of phases of an electrical component;
   detecting, at the electronic controller unit, a phase imbalance in the plurality of phases;
   calculating, at the electronic controller unit, an imbalance ratio of the plurality of phases;
   applying, at the electronic controller unit, a plurality of conditions to the imbalance ratio and to the received input vector, the plurality of conditions being associated with an actual fault in the machine;
   determining, at the electronic controller unit, whether the detected phase imbalance is due to a controls induced phase imbalance in the machine or due to the actual fault in the electrical component of the machine when at least one of the plurality of conditions is met, the controls induced phase imbalance caused by a controls induced phenomena arising when a controls input is provided to the electronic controller unit, by an operator, including;
   storing, in a memory of the electronic controller unit, a deviation index associated with the plurality of phases, the deviation index identifying which one of the plurality of phases had a deviation from an expected electrical parameter value for a current cycle;
   checking whether the deviation index associated with each of the plurality of phases for the current cycle is associated with a same phase in the plurality of phases or with a different phase in the plurality of phases as compared to a previous cycle; and
   determining that the phase imbalance is due to the actual fault in the electrical component when the deviation index does not change between the current cycle and the previous cycle; by
   incrementing or decrementing a counter according to a duration of the current cycle; and
   controlling an output of the machine, using the electronic controller unit, when the phase imbalance is due to the actual fault in the electrical component of the machine.

2. The method of claim 1, wherein the electrical parameter values include current values or magnetic flux values, wherein the imbalance ratio is calculated from the current values as:
   a first ratio including a minimum peak current and a maximum peak current in the plurality of phases, or
   a second ratio including a minimum root mean square current and a maximum root mean square current in the plurality of phases, and
   wherein the imbalance ratio is calculated from the magnetic flux values as:
   a third ratio including a minimum peak magnetic flux and a maximum peak magnetic flux in the plurality of phases, or
   a fourth ratio including a minimum root mean square magnetic flux and a maximum root mean square magnetic flux in the plurality of phases.

3. The method of claim 1, further comprising:
   multiplying the imbalance ratio with a progressive gain to vary a step size for the counter to perform the incrementing or the decrementing; and
   generating a fault vector after taking into account the variable step size when the plurality of conditions have been met for the detecting the phase imbalance.

4. The method of claim 3, wherein the controlling the output of the machine is performed by using the fault vector to shut down the machine.

5. The method of claim 3, wherein the counter is a debounce counter or a batch counter, wherein the debounce counter is configured to clear when the deviation index changes from one phase to another phase in the plurality of phases between the previous cycle and the current cycle, and wherein the batch counter is configured to count down when the deviationindex changes from one phase to another phase in the plurality of phases between the previous cycle and the current cycle.

6. The method of claim 1, wherein the receiving the input vector comprises:
   receiving the input vector after filtering the input vector;
   comparing the input vector with a minimum value vector stored in a memory of the electronic controller unit; and
   determining, as one of the plurality of conditions, whether the input vector is greater than the minimum value vector.

7. The method of claim 1, wherein the plurality of conditions include:
   a first condition associated with whether the input vector is greater than a minimum value vector for a predetermined number of cycles;
   a second condition associated with whether the imbalance ratio is greater than a threshold vector for a current cycle by comparing, at the electronic controller unit, the imbalance ratio with the threshold vector to generate a threshold comparison vector, the threshold vector including at least two values corresponding to an upper threshold value and a lower threshold value, the second condition being met when the threshold comparison vector is generated with at least one non-zero value;
   a third condition associated with whether a first index identifying a first phase in the plurality of phases that has an electrical parameter value different from a predefined maximum electrical parameter value stored in a memory of the electronic controller unit has changed between two consecutive cycles, or whether a second index identifying a second phase in the plurality of phases that has the electrical parameter value different from a predefined minimum electrical parameter value stored in the memory of the electronic controller unit has changed between the two consecutive cycles;

a fourth condition associated with whether the input vector has been obtained for a complete cycle; and a fifth condition associated with whether a torque value of the machine is below a torque input threshold stored in the memory.

8. An electronic controller unit coupled to an electrical component of a machine, the electronic controller unit comprising:

a processor coupled to an input port, an output port, and a memory in the electronic controller unit, the processor configured to execute computer executable instructions for differentiating a phase imbalance due to an actual fault from a controls induced phase imbalance, the controls induced phase imbalance caused by a controls induced phenomena arising when a controls input is provided to the electronic controller unit, by an operator, the computer executable instructions residing on the memory, the computer executable instructions when executed by the processor cause the processor to:

detect the phase imbalance in a plurality of phases of the machine;

calculate an imbalance ratio of the plurality of phases of the electrical component based upon an input vector having electrical parameter values received from the electrical component at the input port of the electronic controller unit, the electrical parameter values being associated with the plurality of phases;

compare the imbalance ratio with a threshold vector stored in the memory to generate a threshold comparison vector, the threshold vector including at least two values corresponding to an upper threshold value and a lower threshold value;

apply at least one of a plurality of conditions stored in the memory to the input vector, the plurality of conditions being associated with the actual fault in the machine;

determine whether the phase imbalance is due to the controls induced phase imbalance in the machine or due to the actual fault in the electrical component in the machine when the threshold comparison vector is generated and the at least one of the plurality of conditions has been met, including;

store, in the memory of the electronic control unit, a deviation index associated with the plurality of phases, the deviation index identifying which one of the plurality of phases had a deviation from an expected electrical parameter value for a current cycle;

check whether the deviation index associated with each of the plurality of phases for the current cycle is associated with a same phase in the plurality of phases or with a different phase in the plurality of phases as compared to a previous cycle; and determine that the phase imbalance is due to the actual fault in the electrical component when the deviation index does not change between the current cycle and the previous cycle; by increment or decrement a counter according to a duration of the current cycle; and control, via the output port of the electronic controller unit, an output of the machine when the phase imbalance is due to the actual fault in the machine.

9. The electronic controller unit of claim 8, wherein the electrical component is, or is a part of, an electric drive of the machine coupled to the electronic controller unit.

10. The electronic controller unit of claim 8, wherein the electronic controller unit is coupled to a display and the processor is configured to:

generate a fault indicator for the display when the phase imbalance is due to the actual fault; and determine if the phase imbalance is due to the controls induced phase imbalance.

11. The electronic controller unit of claim 8, wherein the electrical parameter values are associated with at least two phases of the electrical component of the machine.

12. The electronic controller unit of claim 8, wherein the electrical parameter values include current values or magnetic flux values, wherein the processor is configured to calculate the imbalance ratio from the current values as:

a first ratio including a minimum peak current and a maximum peak current in each of the plurality of phases, or a second ratio including a minimum root mean square current and a maximum root mean square current in each of the plurality of phases, and wherein the processor is configured to calculate the imbalance ratio from the magnetic flux values as:

a third ratio including a minimum peak magnetic flux and a maximum peak magnetic flux in each of the plurality of phases, or a fourth ratio including a minimum root mean square magnetic flux and a maximum root mean square magnetic flux in each of the plurality of phases.

13. The electronic controller unit of claim 8, wherein the processor is configured to determine the phase imbalance by:

multiplying the imbalance ratio with a progressive gain to vary a step size for the counter to perform the incrementing or the decrementing; and generating a fault vector after taking into account the variable step size when the plurality of conditions have been met for the detecting the phase imbalance.

14. The electronic controller unit of claim 13, wherein the processor is configured to control the output of the machine by using the fault vector to shut down the machine.

15. The electronic controller unit of claim 13, wherein the counter is a debounce counter or a batch counter, wherein the debounce counter is configured to clear when the deviation index changes from one phase to another phase in the plurality of phases between the previous cycle and the current cycle, and wherein the batch counter is configured to count down when the deviation index changes from one phase to another phase in the plurality of phases between the previous cycle and the current cycle.

16. The electronic controller unit of claim 8, wherein the memory is configured to store the plurality of conditions including:

a first condition associated with whether the input vector is greater than a minimum value vector for a predetermined number of cycles;

a second condition associated with whether the imbalance ratio is greater than the threshold vector for a current cycle by comparing, at the electronic controller unit, the imbalance ratio with the threshold vector to generate the threshold comparison vector, the second condition being met when the threshold comparison vector is generated with at least one non-zero value, a third condition associated with whether a first index identifying a first phase in the plurality of phases that has an electrical parameter value different from a predefined maximum electrical parameter value stored in the memory of the electronic controller unit has changed between two consecutive cycles, or whether a second index identifying a second phase in the plurality of phases that has the electrical parameter value different from a predefined minimum electrical parameter value stored in the memory of the electronic controller unit has changed between the two consecutive cycles;

a fourth condition associated with whether the input vector has been obtained for a complete cycle; and a fifth condition associated with whether a torque value of the machine is below a torque input threshold stored in the memory.

17. A non-transitory computer readable medium configured to store computer executable instructions thereupon for detecting a phase imbalance of an electrical component in a machine due to an actual fault in the machine, the computer executable instructions when executed by a processor of an electronic controller unit of the machine cause the processor to:

receive an input vector having electrical parameter values from the electrical component, the electrical parameter values associated with a plurality of phases of the electrical component;

compare the input vector against minimum values stored in a minimum value vector;

determine whether the input vector is greater than the minimum value vector for a predefined amount of time;

identify phases with maximum electrical parameter values and minimum electrical parameter values in the input vector for a current cycle;

determine the identified phases as being different from or same as phases with maximum electrical parameter values and minimum electrical parameter values from a previous cycle;

determine if the phase imbalance detected among the plurality of phases of the electrical component is due to the actual fault in the electrical component in the machine, when the phases with the maximum electrical parameter values and the minimum electrical parameter values in the current cycle are the same as the phases identified in the previous cycle, or if the phase imbalance detected among the plurality of phases of the electrical component is due to a controls induced phase imbalance in the machine, the controls induced phase imbalance caused by a controls induced phenomena arising when a controls input is provided to the electronic controller unit, by an operator, including;

store, in a memory of the electronic controller unit, a deviation index associated with the plurality of phases, the deviation index identifying which one of the plurality of phases had a deviation from an expected electrical parameter value for a current cycle;

check whether the deviation index associated with each of the plurality of phases for the current cycle is associated with a same phase in the plurality of phases or with a different phase in the plurality of phases as compared to a previous cycle; and determine that the phase imbalance is due to the actual fault in the electrical component when the deviation index does not change between the current cycle and the previous cycle; by incrementing or decrementing a counter according to a duration of the current cycle; and control, via an output port of the electronic controller unit, an output of the machine when the phase imbalance is due to the actual fault.

* * * * *